(12) United States Patent
Saito et al.

(10) Patent No.: US 8,815,989 B2
(45) Date of Patent: Aug. 26, 2014

(54) RESIN COMPOSITION FOR COATING MATERIAL

(75) Inventors: Takahiro Saito, Takasago (JP); Shinji Kagitani, Takasago (JP); Youichi Matsuo, Takasago (JP)

(73) Assignee: Kaneka Corporation, Osaka (JP)

( * ) Notice: Subject to any disclaimer, the term of this patent is extended or adjusted under 35 U.S.C. 154(b) by 129 days.

(21) Appl. No.: 13/509,481

(22) PCT Filed: Nov. 10, 2010

(86) PCT No.: PCT/JP2010/006594
§ 371 (c)(1),
(2), (4) Date: Jul. 26, 2012

(87) PCT Pub. No.: WO2011/058741
PCT Pub. Date: May 19, 2011

(65) Prior Publication Data
US 2012/0283350 A1 Nov. 8, 2012

(30) Foreign Application Priority Data

| Nov. 13, 2009 | (JP) | 2009-260289 |
| Dec. 1, 2009 | (JP) | 2009-273634 |
| Dec. 1, 2009 | (JP) | 2009-273635 |
| May 13, 2010 | (JP) | 2010-111331 |

(51) Int. Cl.
*C09D 143/00* (2006.01)

(52) U.S. Cl.
USPC ........................................................ 524/261

(58) Field of Classification Search
USPC ........................................................ 524/261
See application file for complete search history.

(56) References Cited

U.S. PATENT DOCUMENTS

| 2008/0038472 A1* | 2/2008 | Suzuki et al. | 427/384 |
| 2009/0252975 A1* | 10/2009 | Lee et al. | 428/447 |

FOREIGN PATENT DOCUMENTS

| JP | 06206914 A | * | 7/1994 |
| JP | 2000-53890 A | | 2/2000 |
| JP | 2004-161782 A | | 6/2004 |
| JP | 2005-15676 A | | 1/2005 |
| JP | 2005-187534 A | | 7/2005 |
| JP | 2006-28290 A | | 2/2006 |
| JP | 2008-255194 A | | 10/2008 |
| JP | 2009-73964 A | | 4/2009 |
| WO | 94/06870 A1 | | 3/1994 |
| WO | WO 2010024428 A1 | * | 3/2010 |

OTHER PUBLICATIONS

English Translation of JP 06-206914A obtained Nov. 12, 2013 at http://www19.ipdl.inpit.go.jp/PA1/cgi-bin/PA1DETAIL.*
International Preliminary Report on Patentability (Form PCT/IB/373) of International Application No. PCT/JP2010/006594 mailed Jun. 12, 2012, with Form PCT/ISA/237 (6 pages).

* cited by examiner

*Primary Examiner* — Ling Choi
*Assistant Examiner* — Lanee Reuther
(74) *Attorney, Agent, or Firm* — Westerman, Hattori, Daniels & Adrian, LLP

(57) ABSTRACT

The invention aims to provide a resin composition having favorable stain resistance and storage stability even in the form of a one-pack coating material. Provided is a resin composition for a coating material, including: (I) a synthetic resin emulsion; (II) a silicon compound represented by the formula (1):

$$(R^1O)_{4-a}SiR^2_a \qquad (1)$$

wherein $R^1$s are the same or different and each represent an alkyl group having 1-10 carbon atoms, an aryl group having 6-10 carbon atoms, or an aralkyl group having 7-10 carbon atoms; $R^2$s are the same or different and each represent an alkyl group having 1-10 carbon atoms, an aryl group having 6-10 carbon atoms, or an aralkyl group having 7-10 carbon atoms; and a represents an integer from 0 to 2; and/or a partial hydrolysis condensation product thereof and/or a modified product thereof; and (III) a photosensitizer.

22 Claims, No Drawings

RESIN COMPOSITION FOR COATING MATERIAL

TECHNICAL FIELD

The present invention relates to a resin composition for a coating material which can form a hydrophilic surface and is suitably used as a coating material for various types of coatings in applications such as the interior or exterior of buildings, roofs, ceramic building materials, automobiles, household electrical appliances, plastics, and the like.

BACKGROUND ART

In the field of coating materials these days, coat films have been demanded to have high performance such as, for example, stain resistance. As a method to impart stain resistance to coating materials, a method of adding a hydrolysable silicon compound, especially an organosilicate, to a coating material is known (Patent Document 1). The hydrophilic coat film formed by the method can reduce attachment of oil-based contaminants, and even can allow attached contaminants to be washed out by water droplets such as rain, thereby exerting stain resistance. As an application of the method to water-based coating materials, a method is known in which an organosilicate and a compound (tin compound, phosphoric acid, etc.) to promote hydrolysis and condensation of an alkoxysilane compound are added as a stain resistance-imparting composition to a water-based coating material so that the resulting mixture is used as a stain-resistant water-based coating material (Patent Document 2).

In the above method, however, if the stain resistance-imparting composition is preliminarily mixed with a water-based coating material, hydrolysis of the organosilicate proceeds due to water in the coating material during storage. As a result, gelation occurs, or the reactivity to induce hydrophilic properties is lost, deteriorating the stain resistance. For this reason, the coating material needs to take a two-pack form in which a composition containing the compound to promote hydrolysis and condensation of an alkoxysilane compound is added at the start of coating. Accordingly, the method has some disadvantages such as complex operations and the necessity of an extra container.
Patent Document 1: WO 1994/06870
Patent Document 2: JP-A 2005-15676

SUMMARY OF THE INVENTION

The present invention aims to solve the technical problem that consists in providing a resin composition for a water-based coating material which can form a hydrophilic surface attributable to a silicon compound, has stability enough to allow a coating material in a one-pack form, and has favorable stain resistance.

The present inventors have found that a resin composition containing a coat film-forming resin, a silicon compound, and a photosensitizer can be prepared into a one-pack composition which is stable under a normal storage condition for coating materials, namely, in a dark place. They also have found that the resulting coated article or coat film can form an excellent hydrophilic surface under normal use conditions for coated articles, namely, under outdoor exposure, or by exposure to other light sources.

The resin composition for a coating material according to the present invention includes: (I) a synthetic resin emulsion; (II) a silicon compound represented by the formula (1):

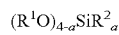 (1)

wherein $R^1$s are the same or different and each represent an alkyl group having 1 to 10 carbon atoms, an aryl group having 6 to 10 carbon atoms, or an aralkyl group having 7 to 10 carbon atoms; $R^2$s are the same or different and each represent an alkyl group having 1 to 10 carbon atoms, an aryl group having 6 to 10 carbon atoms, or an aralkyl group having 7 to 10 carbon atoms; and a represents an integer from 0 to 2; and/or a partial hydrolysis condensation product thereof and/or a modified product thereof; and (III) a photosensitizer.

Preferably, the resin composition for a water-based coating material according to the present invention may further include (IV) a photoacid generator and/or (V) a photobase generator.

Preferably, (II) the silicon compound and/or a partial hydrolysis condensation product thereof and/or a modified product thereof may, for example, be an organosilicate (a compound represented by the formula (2):

 (2)

wherein $R^3$s are the same or different and each represent an alkyl group having 1 to 10 carbon atoms, an aryl group having 6 to 10 carbon atoms, or an aralkyl group having 7 to 10 carbon atoms; and a partial hydrolysis condensation product thereof) and/or a modified product thereof.

Preferably, (II) the silicon compound and/or a partial hydrolysis condensation product thereof and/or a modified product thereof may be dispersed in an aqueous medium using a nonionic surfactant and/or an anionic surfactant.

Preferably, (I) the synthetic resin emulsion may be an acrylic resin emulsion including an alkoxysilyl group-containing monomer unit.

Preferably, a surfactant used for (I) the synthetic resin emulsion may be an alkali metal salt of an anionic surfactant.

Preferably, a surfactant used for an emulsion of (II) the silicon compound and/or a partial hydrolysis condensation product thereof and/or a modified product thereof may be an alkali metal salt of an anionic surfactant.

Since (III) the photosensitizer does not function as a hydrolysis promoter for (II) the silicon compound and/or a partial hydrolysis condensation product thereof and/or a modified product thereof in a dark place, a water-based coating material including a synthetic resin emulsion, (II) the silicon compound and/or a partial hydrolysis condensation product thereof, and a photosensitizer can be stored under a normal storage condition for coating materials, namely, in a dark place.

(III) The photosensitizers may include anthracene derivatives, acetophenone derivatives, benzophenone derivatives, thioxanthone derivatives, and anthraquinone derivatives, and in particular, preferably, compounds having a benzophenone skeleton and/or an anthracene skeleton.

(IV) The photoacid generators may include organic halogen compounds, and preferably halogen-containing triazine compounds, vinylidene chloride copolymers, vinyl chloride copolymers, and chlorinated polyolefins.

Preferably, (IV) the photoacid generator may be an aromatic sulfonium salt or an aromatic iodonium salt.

(V) The photobase generators may include cobalt amine complexes, O-acyloximes, carbamic acid derivatives, formamide derivatives, quaternary ammonium salts, tosylamines, carbamates, and amineimide compounds, and in particular, preferably, O-acyloxime compounds.

Preferably, (V) the photobase generator may be an O-acyloxime containing an aryl group represented by the formula (3):

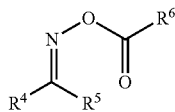

(3)

wherein $R^4$, $R^5$, and $R^6$ may each independently be hydrogen, an alkyl group having 1 to 10 carbon atoms, an aryl group having 1 to 10 carbon atoms, or an aralkyl group having 1 to 10 carbon atoms, and at least one of the $R^4$, $R^5$, and $R^6$ has an aryl group.

Preferably, the resin composition for a water-based coating material according to the present invention may further include (VI) an ultraviolet absorber and/or (VII) a hindered amine light stabilizer, if necessary.

(VI) The ultraviolet absorbers may include compounds having at least one skeleton selected from a triazine skeleton, a benzophenone skeleton, a benzotriazole skeleton, a phenyl salicylate skeleton, and a phenyl benzoate skeleton, and in particular, preferably, those which do not inhibit the light absorption effects of (III) the photosensitizer, (IV) the photoacid generator, and (V) the photobase generator.

Preferably, (VII) the hindered amine light stabilizer may be a compound containing a piperidine ring represented by the formula (4):

—C(CH$_3$)$_2$—N(OR')—C(CH$_3$)$_2$—    (4)

wherein R' represents an organic group having 1 to 20 carbon atoms.

Preferably, the resin composition for a water-based coating material according to the present invention may further include (VIII) a compound capable of being activated by acid to promote hydrolysis and condensation of an alkoxysilyl group, and in particular, a salt of an acidic phosphate compound.

Since (VIII) the compound capable of being activated by acid to promote hydrolysis and condensation of an alkoxysilyl group does not function as a hydrolysis promoter for (II) the silicon compound and/or a partial hydrolysis condensation product thereof in acid-free conditions, a water-based coating material including a synthetic resin emulsion, (II) the silicon compound and/or a partial hydrolysis condensation product thereof, and (VIII) the compound capable of being activated by acid to promote hydrolysis and condensation of an alkoxysilyl group can be stored under a normal storage condition for coating materials, that is, at a pH of 6 to 10.

Moreover, preferably, the resin composition for a water-based coating material according to the present invention may include (IX) an inorganic pigment.

The resin composition for a coating material according to the present invention may be preferably used as a resin composition for a one-pack coating material.

In the case where the coating material according to the present invention is used, after the coating material is applied, it is possible to obtain a coated article or coat film having hydrophilic properties and excellent stain resistance under a normal use condition for coated articles, namely, under outdoor exposure, or optionally by UV irradiation with a UV lamp.

The resin composition for a coating material according to the present invention, which has high storage stability, can allow a coating material in a one-pack form. Moreover, the composition of the present invention can form a coat film having hydrophilic properties and excellent stain resistance under a normal use condition for coated articles, that is, under outside exposure, or optionally by UV irradiation with a UV lamp.

MODES FOR CARRYING OUT THE INVENTION

The present invention is described in detail below based on embodiments thereof.

(1) Synthetic Resin Emulsion

Examples of the synthetic resin emulsion usable in the present invention include, but not limited to, acrylic resin emulsions, urethane resin emulsions, fluorine resin emulsions, epoxy resin emulsions, polyester resin emulsions, alkyd resin emulsions, and melamine resin emulsions. Each of these may be used alone, or two or more kinds thereof may be used in combination. Acrylic resin emulsions are advantageous among these examples in terms of lower costs, greater resin design freedom, and the like.

The acrylic resin emulsions may be those obtained by radical copolymerization of (A) an acrylic monomer and (B) a monomer copolymerizable with the (A).

(A) The acrylic monomer is a methacrylate and/or acrylate each having an alkyl group or an aralkyl group. Specific examples thereof include methyl(meth)acrylate, ethyl(meth) acrylate, iso-propyl(meth)acrylate, n-butyl(meth)acrylate, iso-butyl(meth)acrylate, tert-butyl(meth)acrylate, benzyl (meth)acrylate, cyclohexyl(meth)acrylate, 2-ethylhexyl (meth)acrylate, isodecyl(meth)acrylate, lauryl(meth)acrylate, tridecyl(meth)acrylate, stearyl(meth)acrylate, and isobonyl(meth)acrylate. The term "(meth)acrylate" used herein refers to a methacrylate and/or acrylate.

Among the examples, a (meth)acrylate monomer having an alkyl group having a carbon number of at least 3 but not more than 12 is preferably used because it enables stable emulsion polymerization and because of durability of the coat film such as weather resistance. Particularly preferred examples thereof include (meth)acrylate monomers having a branched alkyl group and/or a cyclic alkyl group, such as iso-butyl(meth)acrylate, tert-butyl(meth)acrylate, cyclohexyl(meth)acrylate, 2-ethylhexyl(meth)acrylate, and isobonyl(meth)acrylate.

The amount of the component (A) based on the total amount of monomers is not particularly limited, and is preferably 50 to 99 parts by weight based on a total of 100 parts by weight of monomers in terms of durability of the coat film such as weather resistance. More preferably, the amount of the component (A) is 80 to 99 parts by weight.

(B) The monomer copolymerizable with the (A) is not particularly limited as long as it is different from the (A) and is copolymerizable therewith. Specific examples thereof include vinyl aromatic hydrocarbon monomers such as styrene, α-methylstyrene, chlorostyrene, 4-hydroxystyrene, and vinyltoluene; vinyl esters and allyl compounds such as vinyl acetate, vinyl propionate, vinyl versatate, and diallyl phthalate; nitrile group-containing vinyl monomers such as (meth) acrylonitrile; epoxy group-containing vinyl monomers such as glycidyl(meth)acrylate; hydroxyl group-containing vinyl monomers such as 2-hydroxypropyl(meth)acrylate, 2-hydroxypropyl(meth)acrylate, 2-hydroxyethyl vinyl ether, hydroxystyrene, Aronix M-5700 (available from Toagosei Co., Ltd.), placcel FA-1, placcel FA-4, placcel FM-1, and placcel FM-4 (all available from Daicel Corporation), HE-10, HE-20, HP-10, HP-20 (all available from Nippon Shokubai Co., Ltd.), Blemmer PEP series, Blemmer NKH-5050, and Blemmer GLM (all available from NOF Corporation), hydroxyl group-containing vinyl-modified hydroxyalkyl vinyl monomers; macromonomers available from Toagosei Co., Ltd. such as AS-6, AN-6, AA-6, AB-6, AK-5 and other compounds; vinyl methyl ether, propylene, and butadiene.

Moreover, hydrophilic vinyl monomers may be used. Examples of usable vinyl monomers having a hydrophilic group include sodium styrenesulfonate, sodium 2-sulfoethyl methacrylate, 2-sulfoethyl methacrylate ammonium, and vinyl monomers having a polyoxyalkylene chain. Although the vinyl monomer having a polyoxyalkylene chain is not particularly limited, it is preferably an acrylic acid ester or methacrylic acid ester having a polyoxyalkylene chain, and specific examples thereof include Blemmer PE-90, PE-200, PE-350, AE-90, AE-200, AE-350, PP-500, PP-800, PP-1000, AP-400, AP-550, AP-800, 700PEP-350B, 10PEP-550B, 55PET-400, 30PET-800, 55PET-800, 30PPT-800, 50PPT-800, 70PPT-800, PME-100, PME-200, PME-400, PME-1000, PME-4000, AME-400, 50POEP-800B, 50AOEP-800B, AEP, AET, APT, PLE, ALE, PSE, ASE, PKE, AKE, PNE, ANE, PNP, ANP, and PNEP-600 (all available from NOF Corporation); Light Ester 130MA, 041MA, and MTG, and Light Acrylate EC-A, MTG-A, 130A, DPM-A, P-200A, NP-4EA, NP-BEA, and EHDG-A (all available from Kyoeisha Chemical Co., Ltd); MA-30, MA-50, MA-100, MA-150, RMA-1120, RMA-564, RMA-568, RMA-506, MPG130-MA, Antox MS-60, MPG-130MA, RMA-150M, RMA-300M, RMA-450M, RA-1020, RA-1120, and RA-1820 (all available from Nippon Nyukazai Co., Ltd.); and NK-ESTER M-20G, M-40G, M-90G, M-230G, AMP-10G, AMP-20G, AMP-60G, AM-90G, and LA (all available from Shin-Nakamura Chemical Co., Ltd.).

Moreover, monomers each having at least two polymerizable unsaturated bonds such as polyethylene glycol di(meth)acrylate, ethylene glycol di(meth)acrylate, triallyl cyanurate, allyl(meth)acrylate, and divinylbenzene may be used. In this case, the produced particles have a crosslinked structure inside the particle, resulting in improvement in the waterproofness of a coat film to be formed.

Further, high levels of water repellency and oil repellency can be imparted by use of a fluorine-containing vinyl monomer such as trifluoro(meth)acrylates, pentafluoro(meth)acrylates, perfluorocyclohexyl(meth)acrylate, 2,2,3,3-tetrafluoropropyl methacrylate, and β-(perfluorooctyl)ethyl(meth)acrylate.

Furthermore, crosslinkability can be imparted by use of a carbonyl group-containing vinyl monomer, such as diacetone acrylamide or methyl vinyl ketone, in combination with a compound containing a hydradine group and/or a hydrazide group, resulting in improvement in the waterproofness of a coat film to be formed.

The amount of the component (B) based on total amount of monomers is not particularly limited, and is preferably 0.1 to 50 parts by weight based on a total of 100 parts by weight of monomers in terms of economic efficiency, functions such as crosslinkability to be imparted, and stability of the emulsion. The amount of the hydrophilic vinyl monomer is more preferably 0.5 to 3 parts by weight.

Still furthermore, an alkoxysilyl group-containing monomer may preferably be used as the component (C) because its use can enhance the durability of the coat film such as waterproofness and weather resistance, and can also improve the stain resistance effect attributable to (II) the silicon compound and/or a partial hydrolysis condensation product thereof.

(C) The alkoxysilyl group-containing monomer is an organic silicon compound having an alkoxy group and a reactive double bond, which is represented by the formula (5):

$$R^7 R^8_{(3-b)} Si(OR^9)_b \qquad (5)$$

wherein $R^7$ represents a monovalent organic group having a polymerizable double bond, $R^8$ represents a C1 to C4 alkyl group, $R^9$ represents a C1 to C4 alkyl group, and b represents 1 to 3. Specific examples thereof include vinyl silanes such as vinyltrimethoxysilane, vinyltriethoxysilane, vinyltripropoxysilane, vinyltriisopropoxysilane, vinylmethyldimethoxysilane, and vinylmethyldiethoxysilane; and acrylic silanes such as γ-(meth)acryloxypropyltrimethoxysilane, γ-(meth)acryloxypropyltriethoxysilane, γ-(meth)acryloxypropyltripropoxysilane, γ-(meth)acryloxypropyltriisopropoxysilane, γ-(meth)acryloxypropyltributoxysilane, γ-(meth)acryloxypropylmethyldimethoxysilane, γ-(meth)acryloxypropylmethyldiethoxysilane, γ-(meth)acryloxypropylmethyldipropoxysilane, γ-(meth)acryloxypropylmethyldiisopropoxysilane, and γ-(meth)acryloxypropylmethyldibuthoxysilane. Each of these may be used alone, or two or more kinds thereof may be used in combination.

The amount of the component (C) used is not particularly limited, and is preferably 0.1 to 20 parts by weight, and more preferably 0.5 to 10 parts by weight, based on a total of 100 parts by weight of monomers. Use of the component (C) in an amount in the above range can reduce crosslinking of the composition during storage and embrittlement due to excessive crosslinking, and thus can enhance the durability.

The carbon number of $R^9$ in the component (C) is inversely related to the reactivity of hydrolysis and condensation of the alkoxysilyl group. The larger the carbon number is, the smaller the reactivity tends to be. Taking the stability in the emulsion into consideration, the carbon number is preferably 2 to 4. Among the above specific examples, preferred are γ-(meth)acryloxypropyltriethoxysilane, γ-(meth)acryloxypropyltriisopropoxysilane, and γ-(meth)acryloxypropylmethyldiethoxysilane. Moreover, in the case where (I) the emulsion is a core/shell emulsion, if the component (C) (for example, γ-(meth)acryloxypropylmethyldimethoxysilane having a methoxysilyl group) in which the carbon number of $R^9$ is small is used for the core part and the component (C) (for example, γ-(meth)acryloxypropyltriethoxysilane having an ethoxysilyl group) in which the carbon number of $R^9$ is large is used for the shell part, a moderately crosslinked structure is introduced into the core part. As a result, higher waterproofness and improved coat film strength can be achieved as well as stable reactivity of the shell part without losing flexibility.

In the case of using the component (C), if a methacrylic acid ester having an alkyl group and/or cycloalkyl group each having 4 or more carbon atoms is used as the component (A) in an amount of 60 parts by weight or more based on a total of 100 parts by weight of monomers, the stability of the alkoxysilyl group in the emulsion can be greatly improved.

In the case of using a hydroxyl group-containing vinyl monomer and/or a vinyl monomer having a polyoxyalkylene chain as the component (B) in an amount of 0.5 to 20 parts by weight based on a total of 100 parts by weight of monomers, the stability of the alkoxysilyl group of the component (C) and of (II) the silicon compound and/or a partial hydrolysis condensation product thereof can be improved. In addition, mechanical stability and chemical stability of the emulsion can be enhanced. In particular, use of a vinyl monomer having a polyoxyalkylene chain is particularly effective.

Next, the method of preparing the acrylic resin emulsion is described below.

The acrylic resin emulsion can be prepared by polymerizing a monomer mixture containing the components (A) and (B) by a known emulsion polymerization method such as batch polymerization, monomer dropping polymerization, and emulsified monomer-dropping polymerization.

A core/shell emulsion is prepared as follows: a monomer mixture to form a core part is polymerized by a known emulsion polymerization method, and then a monomer mixture to form a shell part is polymerized by a known emulsion polymerization method in the presence of an aqueous dispersion liquid of the obtained core component so that the shell component is introduced. Here, the polymerizations of the components for the core part and the shell part each may be performed in steps.

For the emulsion polymerization, a commonly used anionic or nonionic surfactant may be used.

The aqueous medium used for the emulsion polymerization may be any medium that contains water as an essential component, and may contain other organic solvents. Examples of the other organic solvents include alcohol solvents such as ethanol and isopropanol; glycol solvents such as propylene glycol; ether solvents such as ethylene glycol monobutyl ether, propylene glycol monobutyl ether, and propylene glycol dimethyl ether; and ester solvents such as propylene glycol monobutyl ether acetate and CS-12 (available from Chisso Corporation). However, it is preferable to be free from organic solvents in consideration of the stability of the emulsion upon polymerization and the environment.

Examples of the anionic surfactant include sulfate esters having a polyoxyethylene chain such as polyoxyethylene aryl ether sulfates (e.g. polyoxyethylenenonyl phenyl ether sulfate, polyoxyethylene polycyclic phenyl ether sulfate) and polyoxyethylene alkyl ether sulfates (e.g. polyoxyethylene tridecyl ether sulfate); sulfonic acids such as laurylsulfonic acid, dodecylbenzenesulfonic acid, and alkylnaphthalenesulfonic acid; sulfate esters such as lauryl sulfate; and alkyl sulfosuccinates such as di(2-ethylhexyl) sulfosuccinate; and salts of these.

Although a neutralizing cation in the anionic surfactant may be selected from various species, a surfactant containing an alkali metal such as sodium or potassium ion may be used to enhance the stability of (II) the silicone compound and the component (C).

Examples of the nonionic surfactant include those having a polyoxyethylene chain such as polyoxyethylene alkyl ethers, polyoxyethylene alkyl phenyl ethers, polyoxyethylene-polyoxypropylene block copolymers, polyoxyethylene sorbitan fatty acid esters, and polyoxyethylene sorbitol fatty acid esters; those having a hydroxyl group such as sorbitan fatty acid esters, and glycerin fatty acid esters; and silicone surfactants which are polyorganosiloxanes modified with a polyalkylene oxide at one terminal and/or both terminals and/or a side chain, such as KF-351, KF-352, KF-353, KF-354, KF-355, KF-615, KF-618, KF-945, KF-907, X-22-6008, X-22-811, and X-22-812 (all available from Shin-Etsu Chemical Co., Ltd), and SH3748, SH3749, SH3771, SH8400, SF8410 and SF8700 (all available from Dow Corning Toray).

In the present invention, a surfactant having an unsaturated group in one molecule, namely a reactive emulsifier, is preferably used because such a surfactant can suppress bubbling of the composition and a water-based coating material including the composition, and can give favorable waterproofness and weather resistance to a coat film to be obtained. Particularly in the case of using a reactive emulsifier having a polyoxyalkylene group in a molecule, enhanced mechanical stability can be achieved.

Specific examples of the reactive emulsifier include Adeka Reasoap SR-05, SR-10, SR-20, SR-1025, SR-2025, SR-3025, SR-10S, NE-10, NE-20, NE-30, NE-90, SE-10, SE-20, SE-10S, ER-10, ER-20, ER-30, and ER-90 (all available from ADEKA Corporation); Antox-MS-60, RMA-1120, RMA-564, RMA-568, and RMA-506 (all available from Nippon Nyukazai Co., Ltd.); Aquaron KH-05, KH-10, RN-20, RN-30, RN-50, RN-2025, HS-10, HS-20, HS-1025, BC05, BC10, BC0515, and BC1025 (all available from Dai-Ichi Kogyo Seiyaku Co., Ltd.); Eleminol JS-2, JS-20, and RS-30 (all available from Sanyo Chemical Industries Ltd.); and LATEMUL S-180, S-180A, PD-104, PD-420, and PD-930 (all available from Kao Corporation).

Each of these surfactants may be used alone, or two or more kinds thereof may be used in admixture. The neutralizing cation in the anionic surfactant may be a neutralizing species other than those derived from alkali metals, such as those derived from ammonia or organic amines, as long as it does not impair the effects of the present invention.

The total amount of surfactant used is, as the amount of active ingredient, not more than 10 parts by weight, and preferably from 0.5 to 8 parts by weight, relative to a total of 100 parts by weight of monomers.

The amount of the alkali metal salt of an anionic surfactant used based on the total amount of surfactant is, as the amount of active ingredient, preferably 0.5 to 100 parts by weight based on a total of 100 parts by weight of surfactant in consideration of the stability of an emulsion of (II) the silicon compound, and the mechanical stability of the emulsion in question.

There is no limitation on a polymerization initiator to be used. Examples of the polymerization initiator include azo compounds such as azobis-2-methylbutylonitrile; inorganic peroxides such as potassium persulfate; organic peroxides such as cumene hydroperoxide; redox systems combining a peroxide and a reducing agent, and other known polymerization initiators. Among these, redox systems are preferably used as polymerization initiators for more stable polymerization. In order to maintain the stability of the mixture during polymerization and allow more stable polymerization, it is preferable that the temperature is set not higher than 70° C., preferably at 40° C. to 65° C., and the pH is adjusted to 5 to 9 by using a base and/or a buffer.

Examples of initiators used for the redox systems include potassium persulfate, ammonium persulfate, hydrogen peroxide, t-butyl hydroperoxide, benzoyl peroxide, cumene hydroperoxide, and t-butyl peroxylaurate. Examples of the reducing agent to be used in combination with such an initiator include acidic sodium sulfite, Rongalite (sodium formaldehyde sulfoxylate, available from Bruggamann Chemical US), Bruggolite FF-6 (mixture of 2-hydroxy-2-sulfinate-acetic-acid di-sodium salt, sodium sulfite, and 2-hydroxy-2-sulfonate-acetic-acid di-sodium salt, available from Bruggamann Chemical US), thiourea dioxide, and L-ascorbic acid. In particular, a combination of an organic peroxide, such as t-butyl hydroperoxide, benzoyl peroxide and cumene hydroperoxide, and any one of Rongalite, Bruggolite FF-6 and thiourea dioxide is preferred.

In consideration of the environment, the reducing agent is particularly preferably Bruggolite FF-6 or thiourea dioxide each of which does not generate formaldehyde.

The amount of the polymerization initiator used is 0.01 to 10 parts by weight, and more preferably 0.05 to 5 parts by weight, relative to a total of 100 parts by weight of monomers. An amount of the polymerization initiator used of less than 0.01 parts by weight may be less likely to allow polymerization to proceed, and an amount of more than 10 parts by weight tends to reduce the molecular weight of a polymer to be produced.

Moreover, in order to allow the polymerization initiator to stably have catalytic activity, a compound containing a divalent iron ion such as iron sulfate and a chelating agent such as disodium ethylenediaminetetraacetate may be used. The amount of the chelating agent used is 0.0001 to 1 part by weight, and preferably 0.001 to 0.5 parts by weight, relative to a total of 100 parts by weight of monomers.

A chain transfer agent may be added to control the molecular weight of the polymer. Known chain transfer agents may be used, such as mercaptan compounds such as n-dodecyl mercaptan, tert-dodecyl mercaptan, n-butyl mercaptan, γ-mercaptopropyltrimethoxysilane, γ-mercaptopropyltriethoxysilane, γ-mercaptopropylmethyldimethoxysilane, and γ-mercaptopropylmethyldiethoxysilane; organic halides such as chloroform and carbon tetrachloride; sulfidebenzenes, isopropylbenzene, and ferric chloride. The amount of the chain transfer agent used is 0.01 to 5 parts by weight, and preferably 0.05 to 1 part by weight, relative to a total of 100 parts by weight of monomers.

In order to maintain stability of the emulsion, the pH after completion of the polymerization is preferably maintained at 6 to 10 with a base and/or buffer. The base and/or buffer used for the adjustment and maintenance are not particularly limited as long as they are those generally used. Examples of the base include alkali metal hydroxides such as sodium hydroxide and potassium hydroxide, ammonia, and organic amines. Examples of the buffer include carbonates, phosphates and carboxylates, such as sodium hydrogen carbonate and disodium hydrogen phosphate.

In the case of those containing an alkali metal among these pH adjusting agents and buffers, the stability of (II) the silicon compound and the component (C) can be improved. Sodium hydrogen carbonate is more preferably used.

The concentration of resin solids in the synthetic resin emulsion is adjusted to preferably 20 to 70% by weight, and more preferably 30 to 60% by weight. A resin solids concentration of more than 70% by weight significantly increases the viscosity of the system. As a result, heat generated by the polymerization reaction tends to be difficult to remove, and it tends to take a long time to take the emulsion out of the polymerization reactor. A resin solids concentration of less than 20% by weight does not cause any problem in the polymerization operations; however, the amount of resin produced in a single cycle of polymerization operations is small, which is economically disadvantageous and also disadvantageous in that the coating workability and the properties of the coat film are deteriorated, as exemplified by a thinner coat film being obtained.

The synthetic resin emulsion in the present invention preferably has an average particle size of about 0.02-1.0 μm. The average particle size can be adjusted by changing the amount of the surfactant charged at the beginning of polymerization.

(II) Silicon Compound and/or Partial Hydrolysis Condensation Product Thereof.

The silicon compound which is the component (II) in the present invention is represented by the formula (1):

wherein $R^1$s are the same or different and each represent an alkyl group having 1 to 10 carbon atoms, an aryl group having 6 to 10 carbon atoms, or an aralkyl group having 7 to 10 carbon atoms; $R^2$s are the same or different and each represent an alkyl group having 1 to 10 carbon atoms, an aryl group having 6 to 10 carbon atoms, or an aralkyl group having 7 to 10 carbon atoms; and a represents an integer from 0 to 2.

Examples of (II) the silicon compound and/or a partial hydrolysis condensation product thereof include silanes such as tetraalkyl silicates such as tetramethyl silicate, tetraethyl silicate, tetra-n-propyl silicate, tetra-i-propyl silicate, tetra-n-butyl silicate, tetra-i-butyl silicate, and tetra-t-butyl silicate; trialkoxysilanes such as methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, heptyltrimethoxysilane, heptyltriethoxysilane, phenyltrimethoxysilane, phenyltriethoxysilane, octadecyltriethoxysilane, 3-glycidoxypropyltrimethoxysilane, 3-(meth)acryloxypropyltrimethoxysilane, 3-(meth)acryloxypropyltriethoxysilane, vinyltrimethoxysilane, and vinyltriethoxysilane; and dialkoxysilanes such as dimethyldimethoxysilane, dimethyldiethoxysilane, methylphenyldimethoxysilane, diphenyldimethoxysilane, diphenyldiethoxysilane, 3-glycidoxypropylmethyldimethoxysilane, 3-(meth)acryloxypropylmethyldimethoxysilane, and 3-(meth)acryloxypropylmethyldiethoxysilane; and/or partial hydrolysis condensation products of one kind or two or more kinds selected from these silanes. Each of these may be used alone, or two or more kinds thereof may be used in combination.

Among the silicon compounds and/or partial hydrolysis condensation products thereof, preferred are a compound represented by the formula (2):

wherein $R^3$s are the same or different and each represent an alkyl group having 1 to 10 carbon atoms, an aryl group having 6 to 10 carbon atoms, or an aralkyl group having 7 to 10 carbon atoms; and/or a partial hydrolysis condensation product, which correspond to an organosilicate(s), and/or a modified product thereof because of excellent effects in imparting hydrophilic properties to the coat film and in inducing stain resistance.

Examples of the organosilicate include tetraalkyl silicates such as tetramethyl silicate, tetraethyl silicate, tetra-n-propyl silicate, tetra-i-propyl silicate, tetra-n-butyl silicate, tetra-i-butyl silicate, and tetra-t-butyl silicate as mentioned above, and partial hydrolysis condensation products of one kind or two or more kinds selected from these tetraalkyl silicates.

If $R^3$ of the organosilicate has a large carbon number or is branched, the reactivity of hydrolysis and condensation is reduced. In consideration of the storage stability and stain resistance of the composition, $R^3$ is preferably an alkyl group having 2 to 4 carbon atoms. Both of the storage stability and the stain resistance may also be enhanced if two or more kinds of alkyls including a short chain alkyl (for example, ethyl) and a long chain or branched alkyl (for example, i-propyl) are selected as $R^3$s to allow a wider range of reactivity.

In the case of the partial hydrolysis condensation product, the stain resistance can be enhanced. The degree of condensation thereof is 2 to 20, and preferably 3 to 15.

Moreover, the dispersibility in an aqueous medium can be increased by modification to introduce a hydrophilic group, for example, by introducing a hydrophilic polyether containing a hydroxyl group, such as polyoxyalkylenes and polyoxyalkylene monoalkyl ethers, through an ester exchange reaction or the like, or by co-condensation with a hydrophilic group-containing silane compound such as γ-aminopropyltriethoxysilane.

The method of adding the (II) is not particularly limited, and examples of the method include: addition of the (II) directly to the (I) or a coating material composition including the (I); addition of the (II) in the form of an emulsion, as described in, for example, JP-A H08-259892; addition after water solubilization by, for example, co-condensing the (II) and a silane compound containing a hydrophilic group such as γ-aminopropyltriethoxysilane, as described in JP-A H09-

221611; addition of a modified product of the (II) containing a polyoxyalkylene group, as described in WO 1999/05228; addition of a mixture of the (II) with, for example, a water soluble- or self emulsifying-(blocked) isocyanate group-containing compound and/or a carbodiimide compound, as described in JP-A H08-337754; and use of (I) the synthetic resin emulsion containing the (II), as described in JP-A 2002-138123.

Among the methods of adding the (II), preferred is the addition of the (II) in the form of an emulsion, in particular, the addition of an emulsion obtained by dispersing (II) the silicon compound and/or a partial hydrolysis condensation product thereof in an aqueous medium using an anionic surfactant and/or a nonionic surfactant because it improves the storage stability of the water-based coating material composition and the appearance of a coat film to be obtained, and the like.

The aqueous medium used for that emulsion may be any medium that contains water as an essential component, and may contain other organic solvents. Examples of the other organic solvents include alcohol solvents such as ethanol and isopropanol; glycol solvents such as propylene glycol; ether solvents such as ethylene glycol monobutyl ether, propylene glycol monobutyl ether, and propylene glycol dimethyl ether; and ester solvents such as propylene glycol monobutyl ether acetate and CS-12 (available from Chisso Corporation). However, it is preferable to be free from organic solvents in consideration of the stability of the emulsion and the environment.

Examples of the anion in the anionic surfactant include sulfate esters having a polyoxyethylene chain such as polyoxyethylene aryl ether sulfates (e.g. polyoxyethylene nonyl phenyl ether sulfate, polyoxyethylene polycyclic phenyl ether sulfate) and polyoxyethylene alkyl ether sulfates (e.g. polyoxyethylene tridecyl ether sulfate); sulfate esters such as lauryl sulfate; sulfonic acids such as laurylsulfonic acid, dodecylbenzenesulfonic acid, alkylnaphthalenesulfonic acid, and alkyldiphenyletherdisulfonic acid; alkyl sulfosuccinates such as di(2-ethylhexyl)sulfosuccinate; and phosphate esters such as alkyl phosphate esters and polyoxyethylene alkyl ether phosphate esters.

Although the neutralizing cation in the anionic surfactant may be selected from various species, an alkali metal, preferably a sodium or potassium ion, may be used to enhance the stability of (II) the silicone compound and/or a partial hydrolysis condensation product thereof in the emulsion and the water-based coating material composition.

Examples of the nonionic surfactant include those having a polyoxyethylene chain such as polyoxyethylene alkyl ethers, polyoxyethylene alkyl phenyl ethers, polyoxyethylene-polyoxypropylene block copolymers, polyoxyethylene sorbitan fatty acid esters, and polyoxyethylene sorbitol fatty acid esters; those having a hydroxyl group such as sorbitan fatty acid esters and glycerin fatty acid esters; silicone surfactants which are polyorganosiloxanes modified with a polyalkylene oxide at one terminal and/or both terminals and/or a side chain, such as KF-351, KF-352, KF-353, KF-354, KF-355, KF-615, KF-618, KF-945, KF-907, X-22-6008, X-22-811, and X-22-812 (all available from Shin-Etsu Chemical Co., Ltd), and SH3748, SH3749, SH3771, SH8400, SF8410 and SF8700 (all available from Dow Corning Toray); and water-soluble polymers such as acetylene glycol surfactants, polyvinyl alcohol, hydroxyethyl cellulose, and acrylamide copolymers.

Each of these surfactants may be used alone, or two or more kinds thereof may be used in combination. The amount of the surfactant used is, as the amount of active ingredient, 0.05 to 50 parts by weight, and preferably 0.1 to 30 parts by weight, for each 100 parts by weight of the silicon compound. An amount of the surfactant of less than 0.05 parts by weight cannot produce a stable emulsion, and reduces the storage stability. An amount of the surfactant of more than 50 parts by weight leads to some problems such as deterioration of the appearance of a coat film to be obtained and reduction in the waterproofness. The amount of an alkali metal salt of the anionic surfactant based on the total amount of surfactant is, as the amount of active ingredient, preferably 0.5 to 100 parts by weight based on a total of 100 parts by weight of surfactant in terms of the stability of the emulsion of (II) the silicon compound, and the amount is more preferably 30 to 100 parts by weight.

The pH of that emulsion is preferably maintained at 6 to 10. At a pH outside the range, hydrolysis and condensation of the silicon compound and/or a partial hydrolysis condensation product thereof tend to easily occur, deteriorating the storage stability. In particular, if the pH is set lower than pH 6, hydrolysis is promoted and thus condensation progresses faster. If the pH is set higher than pH 10, operational problems occur as well as the emulsion being unstable.

Although the method or order for adjusting and maintaining the pH is not particularly limited, this operation is preferably conducted at the time of preparation of the emulsion. The acid and base used for adjusting the pH and the buffer used for maintaining the pH are not particularly limited as long as they are those generally used. Examples of the base include alkali metal hydroxides such as sodium hydroxide and potassium hydroxide, ammonia, and organic amines. Examples of the buffer include carbonates such as sodium hydrogen carbonate and disodium hydrogen phosphate, phosphates and carboxylates. Among these pH adjusting agents and buffers, those containing an alkali metal are preferred. Sodium hydrogen carbonate is more preferably used.

The concentration of solids of the silicon compound and/or a partial hydrolysis condensation product thereof in the emulsion is preferably 5 to 60% by weight, and more preferably 10 to 40% by weight. A solids concentration of more than 60% by weight may cause some problems such as increase in the viscosity of the (II) and loss of the emulsion stability. A solids concentration of less than 5% by weight is disadvantageous in that the coating workability and the properties of the coat film are deteriorated, as exemplified by a thinner coat film being obtained.

The emulsion is produced by emulsifying the aforementioned components in the aqueous medium by a general emulsifying method. Examples of the emulsifying method include: a so-called phase inversion emulsifying method in which the silicon compound and/or a partial hydrolysis condensation product thereof is mixed with a surfactant, and water is slowly added to the resulting mixture so that the phase is inverted from a water-in-oil emulsion to an oil-in-water emulsion; and a method of mixing or preliminarily emulsifying the components and then finely dispersing the resulting mixture by a mechanical means such as a disperser, a high-pressure homogenizer, or the like.

The (II) is added in an amount of 1 to 50 parts by weight, and preferably 3 to 20 parts by weight, for each 100 parts by weight of the solids of (I) the synthetic resin emulsion. An amount of the (II) of less than 1 part by weight tends not to impart sufficient stain resistance to a coat film to be obtained. An amount of the (II) of more than 50 parts by weight tends to cause some problems such as deterioration of the appearance of the coat film and cracking.

(III) Photosensitizer

The photosensitizer as the component (III) in the present invention is not particularly limited. Examples thereof include anthracene derivatives, benzophenone derivatives, thioxanthone derivatives, and anthraquinone derivatives, and specific examples thereof include 9,10-dialkoxyanthracenes, 2-alkylthioxanthones, 2,4-dialkylthioxanthones, 2-alkylanthraquinones, 2,4-dialkylanthraquinones, p,p'-aminobenzophenone, and 2-hydroxy-4-alkoxybenzophenones. More specific examples thereof include anthrone, anthracene, 9,10-diphenylanthracene, 9-ethoxyanthracene, pyrene, perylene, coronene, phenanthrene, benzophenone, benzil, 9-fluorenone, acetophenone, p,p'-tetramethyldiaminobenzophenone, p,p'-tetraethylaminobenzophenone, 2-chlorothioxanthone, 2-isopropylthioxanthone, 2,4-diethylthioxanthone, phenothiazine, acridine orange, benzoflavin, setoflavin-T, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, Picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), 9,10-dibutoxyanthracene, and 9,10-dipropoxyanthracene. Each of the photosensitizers may be used alone, or two or more kinds thereof may be used in combination.

Among the sensitizers, benzophenone derivatives and anthracene derivatives such as benzophenone and 9,10-dipropoxyanthracene are preferred in terms of improvement in the surface hydrophilic properties of the coat film by light irradiation and the yellowing resistance.

The method of adding the (III) is not particularly limited, and examples of the method include: addition after dissolving the (III) in the (II); addition after dissolving the (III) in a film-forming auxiliary or a solvent; addition of the (III) in a powder form if the (III) is a solid; and addition of the (III) in an emulsion form.

It is necessary to adjust the amount of the (III) to be added according to the desired surface hydrophilic properties. The amount is preferably 0.05 to 30 parts by weight, preferably 0.5 to 20 parts by weight, and more preferably 0.5 to 5 parts by weight, for each 100 parts by weight of the solids of (I) the synthetic resin emulsion. An amount of the (III) of less than 0.05 parts by weight tends not to allow hydrolysis to proceed sufficiently, resulting in insufficient stain resistance of a coat film to be obtained. An amount of the (III) of more than 30 parts by weight tends to cause some problems such as deterioration of the appearance of the coat film and coloring.

(IV) Photoacid Generator

The photoacid generator which is the component (IV) in the present invention is a compound that generates acid when exposed to light. Examples of the photoacid generator include compounds which generate acid when irradiated with radioactive rays as disclosed in JP-A H05-134412, including strong acids such as toluenesulfonic acid, and onium salts such as sulfonium salts (e.g. boron tetrafluorides), ammonium salts, phosphonium salts, iodonium salts, and selenium salts; iron-arene complexes; silanol-metal chelate complexes; sulfonic acid derivatives such as disulfones, disulfonyldiazomethanes, disulfonylmethanes, sulfonylbenzoylmethanes, imidosulfonates, and benzoin sulfonates; and organic halogen compounds.

Among the above photoacid generators, nonionic sulfonic acid derivatives and organic halogen compounds are preferred especially in the case where an ionic surfactant is used to impart dispersion stability to (I) the synthetic resin emulsion because the influence on the stability of the composition is small. Examples of the sulfonic acid derivatives include sulfonic acid esters such as benzoin tosylate, nitrobenzyl tosylate, and succinimide tosylsulfonate as disclosed in, for example, U.S. Pat. No. 4,618,564; oxime sulfonates such as α-(4-tosyloxyimino)-4-methoxybenzyl cyanide as disclosed in U.S. Pat. No. 4,540,598 and JP-A H06-67433; tris(methanesulfonyloxy)benzene and the like as disclosed in JP-A H06-348015; 9,10-dialkoxyanthracenesulfonic acid nitrobenzyl esters and the like as disclosed in JP-A S64-18143; and N-(p-dodecylbenzenesulfonyloxy)-1,8-naphthalimide. Other examples include aromatic sulfonium salts such as triarylsulfonium.$PF_6$ salts, and aromatic iodonium salts such as diphenyliodonium.$CF_3SO_3$ salts and bis(t-butylphenyl)iodonium.$PF_6$ salts. Examples of the organic halogen compounds include halogen-containing triazine compounds such as 2-(4-methosyphenyl)-4,6-bis(trichloromethyl)-1,3,5-triazine, 2-(3,4-dimethoxystyryl)-4,6-bis(trichloromethyl)-1,3,5-triazine, and 2-[2-(5-methylfuran-2-yl)vinyl]-4,6-bis(trichloromethyl)-1, 3,5-triazine as disclosed in JP-A S55-32070, JP-A S48-36281, and JP-A S63-238339; halogen-containing sulfone compounds such as 2-pyridyl-tribromomethyl sulfone as disclosed in JP-A H02-304059; halogenated alkyl phosphate esters such as tris(2-chloropropyl) phosphate, tris(2,3-dichloropropyl) phosphate, and tris(2,3-dibromopropyl) phosphate; halogen-containing heterocyclic compounds such as 2-chloro-6-(trichloromethyl)pyridine; and halogen-containing hydrocarbon compounds such as 1,1-bis[p-chlorophenyl]-2,2,2-trichloroethane, vinyliden chloride copolymers, vinyl chloride copolymers, and chlorinated polyolefins.

The method of adding the (IV) is not particularly limited, and examples of the method include: addition after dissolving the (IV) in the (II); addition after dissolving the (IV) in a film-forming auxiliary or a solvent; addition of the (IV) in a powder form if the (IV) is a solid; and addition of the (IV) in an emulsion form.

It is necessary to adjust the amount of the (IV) to be added according to the amount of acid generated and the generation rate. The amount is preferably 0.05 to 30 parts by weight, and preferably 3 to 20 parts by weight, for each 100 parts by weight of the solids of (I) the synthetic resin emulsion. An amount of the (IV) of less than 0.05 parts by weight tends to lead to an insufficient amount of acid generated, resulting in insufficient stain resistance of a coat film to be obtained. An amount of the (IV) of more than 30 parts by weight tends to cause some problems such as deterioration of the appearance of the coat film and coloring.

(V) Photobase Generator

The photobase generator which is the component (V) in the present invention is not particularly limited. Examples of the photobase generator include cobalt amine complexes, O-acyloximes, carbamic acid derivatives, formamide derivatives, quaternary ammonium salts, tosylamines, carbamates, and aminimide compounds, and specific examples thereof include 2-nitrobenzyl carbamate, 2,5-dinitrobenzyl cyclohexylcarbamate, N-cyclohexyl-4-methylphenylsulfonamide, and 1,1-dimethyl-2-phenylethyl-N-isopropylcarbamate. Each of the photobase generators may be used alone, or two or more kinds thereof may be used in combination.

O-acyloxime compounds are preferably used as the photobase generators, and examples thereof include compounds represented by the formula (3):

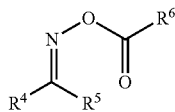

(3)

wherein $R^4$, $R^5$, and $R^6$ may each independently be hydrogen, an alkyl group having 1 to 10 carbon atoms, an aryl group having 1 to 10 carbon atoms, or an aralkyl group having 1 to 10 carbon atoms, and at least one of the $R^4$, $R^5$, and $R^6$ has an aryl group.

The method of adding the (V) is not particularly limited, and examples of the method include: addition after dissolving the (V) in the (II); addition after dissolving the (V) in a film-forming auxiliary or a solvent; addition of the (V) in a powder form if the (V) is a solid; and addition of the (V) in an emulsion form.

It is necessary to adjust the amount of the (V) to be added according to the amount of base generated and the generation rate. The amount is preferably 0.05 to 30 parts by weight, more preferably 0.5 to 20 parts by weight, and further preferably 0.5 to 5 parts by weight, for each 100 parts by weight of the solids of (I) the synthetic resin emulsion. An amount of the (V) of less than 0.05 parts by weight tends to lead to an insufficient amount of base generated, resulting in insufficient stain resistance of a coat film to be obtained. An amount of the (V) of more than 30 parts by weight tends to cause some problems such as deterioration of the appearance of the coat film and coloring.

(VI) Ultraviolet Absorber

The ultraviolet absorber which is the component (VI) is not particularly limited. Examples of the ultraviolet absorber include triazine derivatives, benzophenone derivatives, benzotriazole derivatives, phenyl salicylate derivatives and phenyl benzoate derivatives. Specific examples thereof include 2-hydroxybenzophenone, 5-chloro-2-hydroxybenzophenone, 2,4-dihydroxybenzophenone, 2-hydroxy-4-methoxybenzophenone, 2-hydroxy-4-octyloxybenzophenone, 4-dodecyloxy-2-hydroxybenzophenone, 2-hydroxy-4-octadecyloxybenzophenone, 2,2'-dihydroxy-4-methoxybenzophenone, 2,2'-dihydroxy-4,4'-dimethoxybenzophenone, phenyl salicylate, p-tert-butylphenyl salicylate, p-(1,1,3,3-tetramethylbutyl)phenyl salicylate, 3-hydroxyphenyl benzoate, phenylene-1,3-dibenzoate, 2-(2-hydroxy-5'-methylphenyl)benzotriazole, 2-(2-hydroxy-5-tert-butylphenyl)-5-chlorobenzotriazole, 2-(2-hydroxy-3,5-di-tert-butylphenyl) benzotriazole, 2-(2-hydroxy-5-tert-butylphenyl) benzotriazole, 2-(2-hydroxy-4-octylphenyl)benzotriazole, 2-(2'-hydroxy-5'-methacryloxyethylphenyl)-2H-benzotriazole, and TINUVIN P, TINUVIN PS, TINUVIN 99-2, TINUVIN 109, TINUVIN 234, TINUVIN 326, TINUVIN 328, TINUVIN 329, TINUVIN 360, TINUVIN 384-2, TINUVIN 400, TINUVIN 571, TINUVIN 900, TINUVIN 928, TINUVIN 1130, TINUVIN 1577, and CHIMASSORB 81 (all available from Ciba Japan K.K.). Each of the ultraviolet absorbers may be used alone, or two or more kinds thereof may be used in combination.

The (VI) is preferably an ultraviolet absorber that does not inhibit the light absorption effects of the (III), (IV), and (V). It is preferable for the (VI) to have a maximum absorption wavelength that is not overlapped with that of the (III) in a range from 300 nm to 450 nm, and to have a molar absorption coefficient that is smaller than that of the (III) at the maximum absorption wavelength, in terms of improvement in the hydrophilic properties of the surface of the coat film by light irradiation.

The method of adding the (VI) is not particularly limited, and examples of the method include: addition after dissolving the (VI) in the (II); addition after dissolving the (VI) in a film-forming auxiliary or a solvent; addition of the (VI) in a powder form if the (VI) is a solid; addition of the (VI) in an emulsion form; and a method in which the (VI) having a polymerizable double bond is copolymerized with the components (A) and (B) so as to be contained in (I) the synthetic resin emulsion.

The amount of the (VI) added is 0.05 to 30 parts by weight, preferably 0.5 to 20 parts by weight, and more preferably 0.5 to 5 parts by weight, for each 100 parts by weight of the solids of (I) the synthetic resin emulsion. An amount of the (VI) of less than 0.05 parts by weight tends to result in insufficient effect on the weather resistance of a coat film to be obtained. An amount of the (VI) of more than 30 parts by weight tends to cause some problems such as deterioration of the appearance of the coat film and coloring.

(VII) Hindered Amine Light Stabilizer

Examples of the hindered amine light stabilizer which is the component (VII) include known hindered amine light stabilizers, and specific examples thereof include bis(2,2,6,6-tetramethyl-4-piperidyl)sebacate, bis(1,2,2,6,6-pentamethyl-4-piperidyl)sebacate, bis(1-methoxy-2,2,6,6-tetramethyl-4-piperidyl)sebacate, bis(1-ethoxy-2,2,6,6-tetramethyl-4-piperidyl)sebacate, bis(1-propoxy-2,2,6,6-tetramethyl-4-piperidyl)sebacate, bis(1-butoxy-2,2,6,6-tetramethyl-4-piperidyl)sebacate, bis(1-pentyloxy-2,2,6,6-tetramethyl-4-piperidyl)sebacate, bis(1-hexyloxy-2,2,6,6-tetramethyl-4-piperidyl)sebacate, bis(1-heptyloxy-2,2,6,6-tetramethyl-4-piperidyl)sebacate, bis(1-octoxy-2,2,6,6-tetramethyl-4-piperidyl)sebacate, bis(1-nonyloxy-2,2,6,6-tetramethyl-4-piperidyl)sebacate, bis(1-decanoyloxy-2,2,6,6-tetramethyl-4-piperidyl)sebacate, bis(1-dodecyloxy-2,2,6,6-tetramethyl-4-piperidyl)sebacate, bis(1,2,2,6,6-pentamethyl-4-piperidyl)-2-(4-methoxy-benzylidene) malonate, tetrakis(2,2,6,6-pentamethyl-4-piperidyl) 1,2,3,4-butanetetracarboxylate, tetrakis(1,2,2,6,6-pentamethyl-4-piperidyl) 1,2,3,4-butanetetracarboxylate, condensates of 1,2,3,4-butanetetracarboxylic acid, 1,2,2,6,6-pentamethyl-4-piperidinol and β,β,β,β-tetramethyl-3,9-(2,4,8,10-tetraoxaspiro[5.5]) undecane)diethanol, condensates of 1,2,3,4-butanetetracarboxylic acid, 2,2,6,6-pentamethyl-4-piperidinol and β,β,β,β-tetramethyl-3,9-(2,4,8,10-tetraoxaspiro[5.5]) undecane)diethanol, and TINUVIN 111FDL, TINUVIN 123, TINUVIN 144, TINUVIN 292, and TINUVIN 5100 (all available from Ciba Japan K.K.). Each of the hindered amine light stabilizers may be used alone, or two or more kinds thereof may be used in combination. Moreover, concomitant use of the hindred amine light stabilizer with the ultraviolet absorber can generate synergy effects for the weather resistance.

Among the above hindered amine light stabilizers, preferred are compounds containing a piperidine ring represented by the formula (4):

wherein R' represents an organic group having 1 to 20 carbon atoms, such as TINUVIN 123, in terms of the stability imparted to (II) the silicon compound.

The method of adding the (VII) is not particularly limited, and examples of the method include: addition after dissolving the (VII) in the (II); addition after dissolving the (VII) in a film-forming auxiliary or a solvent; addition of the (VII) in a powder form if the (VII) is a solid; addition of the (VII) in an emulsion form; and a method in which the (VII) having a polymerizable double bond is copolymerized with the components (A) and (B) so as to be contained in (I) the synthetic resin emulsion.

The amount of the (VII) added is 0.05 to 30 parts by weight, preferably 0.5 to 20 parts by weight, and more preferably 0.5 to 5 parts by weight, for each 100 parts by weight of the solids of (I) the synthetic resin emulsion. An amount of the (VII) of less than 0.05 parts by weight tends to result in insufficient effect on the weather resistance of a coat film to be obtained. An amount of the (VII) of more than 30 parts by weight tends to cause some problems such as deterioration of the appearance of the coat film and coloring.

In order to further enhance the hydrophilic properties, (VIII) a compound capable of being activated by acid to promote hydrolysis and condensation of an alkoxysilyl group may be added. The component (VIII) promotes hydrolysis and condensation of an alkoxysilyl group in an acidic condition while this activity is suppressed in a basic condition. Example of the (VIII) include esters or salts of acidic organic compounds such as sulfate compounds, sulfonate compounds, carboxylate compounds, and phosphate compounds, except for those corresponding to the (IV). Specific examples of the (VIII) include t-butyl esters such as t-butyl(meth)acrylate copolymers; salts of alkali metals or alkaline earth metals (e.g. sodium salts, calcium salts) with alkylphosphonic acids, acidic phosphate esters or the like.

Among the esters or salts of acidic organic compounds, salts of acidic phosphate compounds are preferred in terms of improvement in the surface hydrophilic properties of the coat film and small influence on the stability of the composition. Examples of the salts of acidic phosphate compounds include salts of alkali metals (e.g. sodium, potassium) or alkaline earth metals (e.g. magnesium, calcium) with alkylphosphonic acids (e.g. mono-2-ethylhexyl-2-ethylhexylphosphonate); acidic phosphate esters (e.g. dibutyl phosphate, 2-ethylhexyl acid phosphate, di-2-ethylhexyl phosphate, monoisodecyl acid phosphate, diisodecyl phosphate, lauryl acid phosphate, oleyl acid phosphate, stearyl acid phosphate) or the like.

The method of adding the (VIII) is not particularly limited, and examples of the method include: addition after dissolving the (VIII) in the (II); addition after dissolving the (VIII) in a film-forming auxiliary or a solvent; addition of the (VIII) in a powder form if the (VIII) is a solid; and addition of the (VIII) in an emulsion form.

It is necessary to adjust the amount of the (VIII) to be added according to the amount of acid generated from the (VIII) and the generation rate. The amount is 0.05 to 20 parts by weight, and preferably 1 to 10 parts by weight, for each 100 parts by weight of the solids of (I) the synthetic resin emulsion. An amount of the (VIII) of less than 0.05 parts by weight tends not to sufficiently promote a hydrolysis and condensation reaction of an alkoxysilyl group, resulting in insufficient enhancement of the stain resistance of a coat film to be obtained. An amount of the (VIII) of more than 20 parts by weight tends to cause some problems such as deterioration of the waterproofness of the coat film.

(IX) Inorganic Pigment

The inorganic pigment which is the component (IX) in the present invention is not particularly limited, and examples thereof include pigments commonly used for coating materials, such as color pigments such as titanium dioxide, carbon black, and red iron oxide; body pigments such as kaolin, talc, aluminum silicate, calcium carbonate, mica, and clay; anticorrosive pigments such as zinc phosphate, iron phosphate, aluminum phosphate, calcium phosphate, zinc phosphite, zinc cyanide, zinc oxide, aluminum tripolyphosphate, zinc molybdate, aluminum molybdate, calcium molybdate, aluminum phosphomolybdate, and aluminum zinc phosphomolybdate.

The method of adding the inorganic pigment is not particularly limited, and examples thereof include: addition of the inorganic pigment directly to the (I) or a coating material composition including the (I); and addition of the inorganic pigment in the form of a pigment-dispersed paste by dispersing the inorganic pigment in an aqueous medium with an ordinary dispersing device such as a ball mill or a sand grind mill until the inorganic pigment has a predetermined uniform particle size.

Among the methods of adding the (IX), preferred is the addition of a pigment-dispersed paste because it enhances the storage stability of the water-based coating material composition, the appearance of a coat film to be obtained, and the like.

It is necessary to adjust the amount of the (IX) to be added according to the purpose. The amount is 5 to 200 parts by weight, and preferably 50 to 100 parts by weight, for each 100 parts by weight of the solids of (I) the synthetic resin emulsion. An amount of the (IX) of more than 200 parts by weight tends to cause some problems such as deterioration of the appearance of the coat film.

A composition including the (I) to (IX) can be prepared into a one-pack composition which is stable in a dark place, and can form an excellent hydrophilic surface.

The resin composition for a coating material of the present invention can be obtained by mixing the (I) to (IX) in any order. The mixing method is not particularly limited, and may be any general mixing method.

The formulation form of the resin-composition for a coating material of the present invention may be a one-pack formulation form containing all components. The resin composition for a coating material of the present invention has excellent storage stability, and is stable for a long time under a shaded and sealed condition with all components being included. In addition, there is no deterioration of the physical properties of a coat film to be obtained.

Additives which are usually used for coating, materials may be added, if necessary, to the composition obtained. Examples of the additives include: organic pigments such as anthraquinone pigments, anthrapyrimidine pigments, azo pigments, azomethine pigments, quinacridone pigments, quinophthalone pigments, diketopyrrolopyrrole pigments, indanthrone pigments, isoindoline pigments, isoindolinone pigments, metal complex pigments, perinone pigments, perylene pigments, phthalocyanine pigments, pyranthrone pigments, pyrazolo-quinazolone pigments, and thioindigo pigments, film-forming auxiliaries such as alcohols such as benzyl alcohol; glycols such as ethylene glycol monobutyl ether, propylene glycol monomethyl ether, propylene glycol monobutyl ether, dipropylene glycol monomethyl ether, and dipropylene glycol monobutyl ether; glycol esters such as ethylene glycol monobutyl ether acetate, and 2,2,4-trimethyl-1,3-pentanediol monoisobutylate, colloidal silica, plasticizers, solvents, dispersing agents, wetting agents, thickners, preservatives, anti-freezing agents, light stabilizers, ultraviolet absorbers, and defoaming agents.

EXAMPLES

The present invention is described in more detail below by way of examples. However, the present invention is not limited only to the examples.

(Materials Used)
(Synthesis Example of Acrylic Resin Emulsion)

First, 160 parts by weight of deionized water, 0.35 parts by weight of Newcol-707SN (available from Nippon Nyukazai Co., Ltd, active ingredient: 30%, polyoxyethylene polycyclic phenyl ether sulfate sodium salt), and 0.25 parts by weight of a 5% aqueous sodium hydrogen carbonate solution were initially charged in a reaction vessel equipped with a stirrer, a reflux condenser, a nitrogen gas feed pipe, and a dropping funnel. The reaction vessel was heated to 50° C. while nitrogen gas was introduced. After heating, to the reaction vessel were added 0.5 parts by weight of a 7% aqueous t-butyl hydroperoxide solution, 0.28 parts by weight of a 20% aqueous Bruggolite FF-6 solution, and 0.35 parts by weight of a mixed aqueous solution of 0.10% ferrous sulfate heptahydrate and 0.40% disodium ethylenediaminetetraacetate, and a monomer emulsion for a first step was further added at a constant speed over 200 minutes which was prepared by adding 0.75 parts by weight of Adeka Reasoap SR-10S (available from ADEKA Corporation, active ingredient: 100%, polyoxyethylene-1-alkoxymethyl-2-(2-propenyloxy)ethyl ether sulfate sodium salt), 0.47 parts by weight of Adeka Reasoap ER-20 (available from ADEKA Corporation, active ingredient: 75%, polyoxyethylene-1-alkoxymethyl-2-(2-propenyloxy)ethyl ether), and 20 parts by weight of deionized water to 50 parts by weight of a mixture of 16.04 parts by weight of 2-ethylhexyl acrylate, 33 parts by weight of butyl methacrylate, and 0.94 parts by weight of γ-methacryloxypropylmethyldimethoxysilane followed by emulsifying. During the addition, 0.55 parts by weight of a 7% aqueous t-butyl hydroperoxide solution and 0.43 parts by weight of a 2.5% aqueous Bruggolite FF-6 solution were added in three aliquots. After completion of the addition of the monomer emulsion, postpolymerization was carried out for one hour. Thereafter, to the reaction vessel were added 0.25 parts by weight of a 7% aqueous t-butyl hydroperoxide solution, 0.55 parts by weight of a 2.5% aqueous Bruggolite FF-6 solution, and 0.35 parts by weight of a mixed aqueous solution of 0.10% ferrous sulfate heptahydrate and 0.40% disodium ethylenediaminetetraacetate, and a monomer emulsion for a second step was further added at a constant speed over 200 minutes which was prepared by adding 0.75 parts by weight of Adeka Reasoap SR-10S, 0.47 parts by weight of Adeka Reasoap ER-20, and 20 parts by weight of deionized water to 50 parts by weight of a mixture of 9.25 parts by weight of methyl methacrylate, 37 parts by weight of butyl methacrylate, 0.5 parts by weight of γ-methacryloxypropyltriethoxysilane, 3 parts by weight of Blemmer PE-200 (available from NOF Corporation) which is a vinyl monomer having a polyoxyethylene chain, and 0.25 parts by weight of n-dodecyl mercaptan followed by emulsifying. During the addition, 0.6 parts by weight of a 7% aqueous t-butyl hydroperoxide solution and 0.85 parts by weight of a 2.5% aqueous Bruggolite FF-6 solution were added in four aliquots. After completion of the addition of the monomer emulsion, postpolymerization was carried out for one and a half hours. Subsequently, 5.5 parts by weight of a 5% aqueous sodium hydrogen carbonate solution was added to the resulting emulsion, and then deionized water was added to adjust the solids content to 50, whereby an acrylic resin emulsion (I-1) was obtained. Measurement with a dynamic light scattering particle size analyzer (MICROTRAC UPA, Model 9340-UPA, available from Nikkiso Co., Ltd.) found that the emulsion thus obtained had a volume average particle size of 200 nm.

(Production Example of Emulsion of Silicon Compound)

To a mixture of 30 parts by weight of Silicate 40 (available from Tama Chemicals Co., Ltd), 10 parts by weight of NEO-COL SW-C (available from Dai-Ichi Kogyo Seiyaku Co., Ltd., active ingredient: 70%, dialkyl sulfosuccinate sodium salt), and 5 parts by weight of HITENOL XJ-630S (available from Dai-Ichi Kogyo Seiyaku Co., Ltd., active ingredient: 95%, polyoxyalkylene alkyl ether sulfate sodium salt) were added 6 parts by weight of 5% aqueous sodium bicarbonate and 4 parts by weight of deionized water with stirring at 40° C. One hour later, 50 parts by weight of deionized water was added dropwise at 40° C. so that an emulsion of a silicon compound (II-1) with an effective solids concentration of 30% was obtained.

(Production Example of Water-Based Resin Composition)

To 103 parts by weight of the acrylic resin emulsion (I-1) was added 17 parts by weight of the emulsion of the silicon compound (II-1) obtained by the production example (10 parts by weight of (II) the silicon compound and/or a partial hydrolysis condensation product thereof for each 100 parts by weight of the solids of the (I)), followed by mixing with a stirrer for 10 minutes at a room temperature. A pigment paste shown in Table 1 and additives shown in Table 2 or 3 were added to the resulting mixture under stirring at a room temperature so that a white enamel coating material was obtained. ALES GUMTILE SEALER (available from Kansai Paint Co., Ltd) was air-sprayed onto a slate board in accordance with JIS A5430 with a thickness of 4 mm, width of 40 mm and length of 150 mm at a room temperature, and dried for one day. The white enamel coating material was twice air-sprayed onto the resulting slate board at a room temperature with an interval between sprays of 24 hours (total applied amount: about 0.6 kg/m$^2$), and then cured at a room temperature for seven days in a room not exposed to direct sunlight, whereby a coated board was prepared. Outdoor exposure of the coated boards thus prepared was performed by placing and fixing the board to face south at an inclination of 45° at a place in Takasago city in Hyogo prefecture in Japan. Then, the water contact angle upon completion of the curing (initial water contact angle), the water contact angles after predetermined exposure periods, and the stain resistance after these exposure periods were measured. Similarly, coated boards were prepared for measuring the weather resistance, and an accelerated weathering test was performed.

TABLE 1

Formulation for preparing pigment paste (parts by weight)

| | | | |
|---|---|---|---|
| Deionized water | | | 109.4 |
| Anti-freezing agent | Propylene glycol | | 48.3 |
| Wetting-dispersing agent | Disperbyk-190 | available from BYK Japan K.K. | 42.7 |
| | Hydropalat 3037 | available from Cognis Japan Ltd. | 4.8 |
| Titanium oxide | D-918 | available from Sakai Chemical Industry Co., Ltd. | 487.57 |
| Preservative | Thrauto 99N | available from Japan EnviroChemicals, Ltd | 4.83 |
| Defoaming agent | AGITAN 295 | available from MUNZING CHEMIE GmbH | 2.41 |
| Total | | | 700.01 |

Further, the white enamel coating material obtained according to the aforementioned method was allowed to stand still at 50° C. under a shaded and sealed condition. A coated board was prepared in a similar manner using the coating material after two weeks standing, and was subjected to an outdoor exposure test. Then, the water contact angle upon completion of the curing (initial water contact angle), the water contact angles after predetermined exposure periods, and the stain resistance after these exposure periods were measured. Tables 2 and 3 show the results.

TABLE 2

White enamel coat film. Surface hydrophilic properties, Stain resistance

| | | | Example 1 | Example 2 | Example 3 | Example 4 | Example 5 | Example 6 | Example 7 | Example 8 | Example 9 |
|---|---|---|---|---|---|---|---|---|---|---|---|
| Formulation of coating material | Water-based resin | (I-1) + (II-1) | 120 | 120 | 120 | 120 | 120 | 120 | 120 | 120 | 120 |
| | Component (III) | (III-1) | 1.03 | | | | | | | 0.52 | |
| | | (III-2) | | 1.03 | | | | | | | |
| | | (III-3) | | | 1.03 | | | | | | |
| | | (III-4) | | | | 1.03 | | | | | 0.52 |
| | Component (IV) | (IV-1) | | | | | | 8.6 | | 8.6 | |
| | | (IV-2) | | | | | | | 0.52 | | 0.52 |
| | Component (V) | (V-1) | | | | | | | | | |
| | Component (VI) | (VI-1) | | | | | | | | | |
| | Component (VII) | (VII-1) | | | | | 2.06 | | | | |
| | Dibutyltin bis-dodecyl mercaptide | | | | | | | | | | |
| | Film-forming auxiliary | CS12 | 4.8 | 4.8 | 4.8 | 4.8 | 4.8 | 4.8 | 4.8 | 4.8 | 4.8 |
| | | DPnB | 4.8 | 4.8 | 4.8 | 4.8 | 4.8 | 4.8 | 4.8 | 4.8 | 4.8 |
| | Pigment paste (Table 1) | | 58 | 58 | 58 | 58 | 58 | 58 | 58 | 58 | 58 |
| | Thickener | UH-526 | 1.4 | 1.4 | 1.4 | 1.4 | 1.4 | 1.4 | 1.4 | 1.4 | 1.4 |
| | | N330 (diluted to 3%) | 6.8 | 6.8 | 6.8 | 6.8 | 6.8 | 6.8 | 6.8 | 6.8 | 6.8 |
| | Defoaming agent | AGITAN 295 | 0.4 | 0.4 | 0.4 | 0.4 | 0.4 | 0.4 | 0.4 | 0.4 | 0.4 |
| | pH adjusting agent | Aqueous sodium bicarbonate | 6.4 | 6.4 | 6.4 | 6.4 | 6.4 | 6.4 | 6.4 | 6.4 | 6.4 |
| | | | Before storage | | | | | | | | |
| Water contact angle [°] | Outdoor exposure | Initial | 78 | 76 | 79 | 78 | 81 | 84 | 76 | 73 | 86 |
| | | 1 month | 59 | 44 | 53 | 66 | 68 | 67 | 65 | 65 | 61 |
| | | 3 months | 51 | 49 | 50 | 49 | 68 | 65 | 69 | 64 | 45 |
| Stain resistance ΔL | Outdoor exposure | 1 month | −0.7 | −1.7 | −0.5 | −0.2 | −1.8 | −1.9 | −1.5 | −1.0 | −0.5 |
| | | 3 months | −2.0 | −1.7 | −2.1 | −1.3 | −3.2 | −3.0 | −3.2 | −2.1 | −1.2 |
| Weather resistance 60° Gloss Gloss retention ratio [%] | XWOM | Initial gloss | 74 | 70 | 76 | 75 | 73 | 71 | 70 | 73 | 75 |
| | | 2500 hours | 82 | 89 | 92 | 90 | 93 | 91 | 85 | 85 | 89 |
| | | 4000 hours | 61 | 78 | 84 | 78 | 84 | 84 | 81 | 71 | 83 |
| | | | After 2 weeks storage at 50° C. | | | | | | | | |
| Water contact angle [°] | Outdoor exposure | Initial | 74 | 73 | 73 | 69 | 76 | 78 | 70 | 77 | 82 |
| | | 1 month | 69 | 63 | 59 | 67 | 70 | 69 | 67 | 68 | 65 |
| | | 3 months | 65 | 62 | 68 | 60 | 68 | 69 | 70 | 69 | 58 |
| Stain resistance ΔL | Outdoor exposure | 1 month | −1.0 | −1.0 | −0.4 | −0.5 | −1.8 | −2.0 | −1.5 | −0.8 | −0.8 |
| | | 3 months | −2.4 | −2.1 | −2.8 | −1.9 | −2.8 | −3.3 | −3.6 | −2.0 | −1.5 |

(III-1): 2-isopropylthioxanthone
(III-2): 2-ethylanthraquinone
(III-3): 9,10-dipropoxyanthracene
(III-4): benzophenone
(IV-1): S200, available from KANEKA Corporation, vinyl chloride emulsion polymer, solids content: 44.1%
(IV-2): diphenyl[4-(phenylthio)phenyl]sulfonium hexafluorophosphate
(V-1): acetoxime benzoate
(VI-1): TINUVIN 1130, available from Ciba Japan K.K.
(VII-1): TINUVIN 123, available from Ciba Japan K.K.
CS12: CS-12, available from Chisso Corporation
DPnB: Dowanol DPnB, available from Dow Chemical Japan, Ltd., propylene glycol monobutyl ether
UH-526: Adekanol UH-526, available from ADEKA Corporation
N330 (diluted to 3%): 3 wt % solution obtained by dissolving Natrosol Plus 330 (available from Aqualon) in deionized water made basic with ammonia water
AGITAN 295: AGITAN 295, available from MUNZING CHEMIE GmbH
Aqueous sodium bicarbonate: 5 wt % aqueous sodium hydrogen carbonate solution

TABLE 3

White enamel coat film. Surface hydrophilic properties, Stain resistance

| | | | Example 10 | Example 11 | Example 12 | Example 13 | Example 14 | Example 15 | Example 16 | Comparative Example 1 | Comparative Example 2 |
|---|---|---|---|---|---|---|---|---|---|---|---|
| Formulation of coating material | Water-based resin | (I-1) + (II-1) | 120 | 120 | 120 | 120 | 120 | 120 | 120 | 120 | 120 |
| | Component (III) | (III-1) | 0.52 | | | | | | | | |
| | | (III-2) | | | | | | | | | |
| | | (III-3) | | | | | | | | | |
| | | (III-4) | | 0.52 | 0.52 | 0.52 | 0.52 | 1.03 | 1.03 | | |

TABLE 3-continued

White enamel coat film. Surface hydrophilic properties, Stain resistance

|  |  |  | Example 10 | Example 11 | Example 12 | Example 13 | Example 14 | Example 15 | Example 16 | Comparative Example 1 | Comparative Example 2 |
|---|---|---|---|---|---|---|---|---|---|---|---|
| | Component (IV) | (IV-1) | | 8.6 | | 8.6 | | | | | |
| | | (IV-2) | | | | | | | | | |
| | Component (V) | (V-1) | 0.52 | | 0.52 | | 0.52 | | | | |
| | Component (VI) | (VI-1) | | | | 0.52 | 0.52 | 0.52 | | | |
| | Component (VII) | (VII-1) | | | | 0.52 | | | 0.52 | | |
| | Dibutyltin bis-dodecyl mercaptide | | | | | | | | | | 0.52 |
| | Film-forming | CS12 | 4.8 | 4.8 | 4.8 | 4.8 | 4.8 | 4.8 | 4.8 | 4.8 | 4.8 |
| | auxiliary | DPnB | 4.8 | 4.8 | 4.8 | 4.8 | 4.8 | 4.8 | 4.8 | 4.8 | 4.8 |
| | Pigment paste (Table 1) | | 58 | 58 | 58 | 58 | 58 | 58 | 58 | 58 | 58 |
| | Thickner | UH-526 | 1.4 | 1.4 | 1.4 | 1.4 | 1.4 | 1.4 | 1.4 | 1.4 | 1.4 |
| | | N330 (diluted to 3%) | 6.8 | 6.8 | 6.8 | 6.8 | 6.8 | 6.8 | 6.8 | 6.8 | 6.8 |
| | Defoaming agent | AGITAN 295 | 0.4 | 0.4 | 0.4 | 0.4 | 0.4 | 0.4 | 0.4 | 0.4 | 0.4 |
| | pH adjusting agent | Aqueous sodium bicarbonate | 6.4 | 6.4 | 6.4 | 6.4 | 6.4 | 6.4 | 6.4 | 6.4 | 6.4 |
| | | | | | Before storage | | | | | | |
| Water contact angle [°] | Outdoor exposure | Initial | 71 | 80 | 78 | 82 | 78 | 78 | 74 | 73 | 72 |
| | | 1 month | 60 | 67 | 69 | 65 | 66 | 65 | 61 | 77 | 54 |
| | | 3 months | 60 | 66 | 66 | 65 | 66 | 59 | 62 | 78 | 46 |
| Stain resistance ΔL | Outdoor exposure | 1 month | −0.8 | −1.0 | −0.9 | −1.6 | −1.8 | −1.2 | −0.7 | −2.2 | −0.7 |
| | | 3 months | −1.9 | −2.0 | −2.1 | −2.0 | −2.0 | −1.9 | −1.6 | −7.5 | −1.5 |
| Weather resistance 60° Gloss Gloss retention ratio [%] | XWOM | Initial gloss | 70 | 73 | 74 | 66 | 70 | 72 | 68 | 78 | 72 |
| | | 2500 hours | 84 | 90 | 88 | 98 | 96 | 97 | 90 | 87 | 98 |
| | | 4000 hours | 73 | 81 | 82 | 97 | 90 | 91 | 89 | 81 | 92 |
| | | | | | After 2 weeks storage at 50° C. | | | | | | |
| Water contact angle [°] | Outdoor exposure | Initial | 73 | 75 | 74 | 78 | 76 | 71 | 75 | 72 | — |
| | | 1 month | 62 | 66 | 69 | 68 | 68 | 65 | 65 | 82 | — |
| | | 3 months | 65 | 68 | 69 | 67 | 69 | 64 | 61 | 78 | — |
| Stain resistance ΔL | Outdoor exposure | 1 month | −0.7 | −0.8 | −0.8 | −1.2 | −1.8 | −1.4 | −1.1 | −2.2 | — |
| | | 3 months | −1.9 | −1.8 | −2.1 | −2.0 | −1.9 | −1.4 | −1.6 | −7.7 | — |

(III-1): 2-isopropylthioxanthone
(III-2): 2-ethylanthraquinone
(III-3): 9,10-dipropoxyanthracene
(III-4): benzophenone
(IV-1): S200, available from KANEKA Corporation, vinyl chloride emulsion polymer, solids content: 44.1%
(IV-2): diphenyl[4-(phenylthio)phenyl]sulfonium hexafluorophosphate
(V-1): acetoxime benzoate
(VI-1): TINUVIN 1130, available from Ciba Japan K.K.
(VII-1): TINUVIN 123, available from Ciba Japan K.K.
CS12: CS-12, available from Chisso Corporation
DPnB: Dowanol DPnB, available from Dow Chemical Japan, Ltd., propylene glycol monobutyl ether
UH-526: Adekanol UH-526, available from ADEKA Corporation
N330 (diluted to 3%): 3 wt % solution obtained by dissolving Natrosol Plus 330 (available from Aqualon) in deionized water made basic with ammonia water
AGITAN 295: AGITAN 295, available from MUNZING CHEMIE GmbH
Aqueous sodium bicarbonate: 5 wt % aqueous sodium hydrogen carbonate solution The measurements were as follows.

Water Contact Angle

The pure water contact angle was measured with a contact angle measuring device (CA-S150, available from Kyowa Interface Science Co., Ltd.). Lower contact angles indicate higher surface hydrophilic properties, corresponding to higher stain resistance. In the case of the contact angle of 70° or smaller, the stain-resistant effect actually tends to be significantly larger in the outdoor exposure test.

Stain Resistance

The values of L*, a*, and b* were measured with a colorimeter (CR-300, available from Konica Minolta Holdings, Inc.) before the start of exposure and after predetermined exposure periods. Brightness differences (ΔL) were calculated based on the values of L* after the exposure periods and the value of L* before the start of exposure. Larger values ΔL (closer to 0) indicate smaller changes in color phase caused by attachment of contaminants, corresponding to higher stain resistance.

Gloss

The gloss was measured with a glossmeter (Multi-gloss 268, available Konica Minolta Holdings, Inc.). Higher values indicate better appearance.

Weather Resistance (WXOM)

A weathering test was carried out with a tester (Atlas Ci4000 Xenon Weather-Ometer, available from Toyo Seiki Seisaku-Sho Ltd.) under the conditions of a wavelength from 295 to 800 nm, a UV irradiation intensity of 550 W/m$^2$, and exposure periods of 2500 hours and 4000 hours. Gloss values of the coat films were measured, and gloss retention ratios relative to the initial 60° mirror gloss were determined after the exposure periods. Higher gloss retention ratios indicate higher weather resistance.

In each of Examples 1 to 16, when the board coated with the white enamel coating material was subjected to outdoor exposure, the water contact angle decreased with exposure time, with the water contact angle being 70° or smaller after one month exposure. Thus, excellent surface hydrophilic properties were observed on the exposure under actual use conditions. In contrast, in Comparative Example 1 in which the component (III), (IV) or (V) was not contained, the water contact angle of the coated board was changed to 77° after one month outdoor exposure and to 78° after three months outdoor exposure, which indicates insufficient surface hydrophilizing effect. Actually, in Examples 1 to 16 compared to Comparative Example 1, changes in the value ΔL were also smaller, and thus the effect of imparting stain resistance was also observed.

Moreover, in Examples 1 to 16, even if the coating material after two weeks storage at 50° C. was used, the water contact angle was found to be 70° or smaller after one month outdoor exposure, and changes in ΔL were also smaller than that in Comparative Example 1. Thus, the effects of hydrophilizing the surface and imparting stain resistance were observed.

In the case where the components (VI) and/or (VII) were added, the resistance to accelerated weathering was enhanced, and deterioration in the stain resistance was not observed.

In Comparative Example 2 in which an organotin compound was used instead of the component (III), (IV) or (V), in the case of using the coating material before storage, the contact angle after one month exposure was 54°, indicating favorable surface hydrophilic properties, while the effect of imparting stain resistance was sufficient. However, the viscosity of the coating material was increased during storage, and the coating material was solidified after two weeks storage. Thus, the coating material lacked in sufficient storage stability and therefore had no properties as a one-pack coating material.

Accordingly, the resin composition of the present invention was demonstrated to have favorable surface hydrophilic properties and storage stability even in the form of a one-pack coating material. It is thus demonstrated that the resin composition of the present invention is useful as a water-based resin composition capable of forming a coat film with excellent stain resistance.

INDUSTRIAL APPLICABILITY

The resin composition of the present invention can be used as a coating material or a surface treatment agent, for example, for the interior or exterior of buildings; automobiles (e.g. metallic bases, clear coats on the metallic bases); direct application to metals such as aluminum and stainless steel; direct application to ceramics such as slates, concrete, roof tiles, mortar, plaster boards, asbestos slates, asbestos boards, precast concrete, aerated light-weight concrete, calcium silicate plates, tiles and bricks; glass; and stones such as natural marble and granite.

The invention claimed is:

1. A resin composition for a water-based coating material, comprising:
(I) a synthetic resin emulsion;
(II) a silicon compound represented by the formula (2):

$$(R^3O)_4Si \qquad (2)$$

wherein $R^3$s are the same or different and each represent an alkyl group having 1 to 10 carbon atoms, an aryl group having 6 to 10 carbon atoms, or an aralkyl group having 7 to 10 carbon atoms;
and/or a partial hydrolysis condensation product thereof and/or a modified product thereof; and
(III) a photosensitizer.

2. The resin composition for a water-based coating material according to claim 1, further comprising:
(IV) a photoacid generator and/or (V) a photobase generator.

3. A resin composition for a water-based coating material, comprising:
(I) a synthetic resin emulsion;
(II) a silicon compound represented by the formula (2):

$$(R^3O)_4Si \qquad (2)$$

wherein $R^3$s are the same or different and each represent an alkyl group having 1 to 10 carbon atoms, an aryl group having 6 to 10 carbon atoms, or an aralkyl group having 7 to 10 carbon atoms;
and/or a partial hydrolysis condensation product thereof and/or a modified product thereof; and
(IV) a photoacid generator and/or (V) a photobase generator.

4. The resin composition for a water-based coating material according to any one of claims 1 to 2,
wherein (II) the silicon compound and/or a partial hydrolysis condensation product thereof and/or a modified product thereof is dispersed in an aqueous medium using a nonionic surfactant and/or an anionic surfactant.

5. The resin composition for a water-based coating material according to claim 4,
wherein the surfactant used for an emulsion of (II) the silicon compound and/or a partial hydrolysis condensation product thereof and/or a modified product thereof is an alkali metal salt of an anionic surfactant.

6. The resin composition for a water-based coating material according to any one of claims 1 to 2,
wherein the synthetic resin emulsion is an acrylic resin emulsion including an alkoxysilyl group-containing monomer unit.

7. The resin composition for a water-based coating material according to any one of claims 1 to 2,
wherein a surfactant used for (I) the synthetic resin emulsion is an alkali metal salt of an anionic surfactant.

8. The resin composition for a water-based coating material according to claim 1 or 2,
wherein (III) the photosensitizer is at least one selected from the group consisting of anthracene derivatives, acetophenone derivatives, benzophenone derivatives, thioxanthone derivatives, and anthraquinone derivatives.

9. The resin composition for a water-based coating material according to claim 8,
wherein (III) the photosensitizer is a compound having a benzophenone skeleton and/or an anthracene skeleton.

10. The resin composition for a water-based coating material according to claim 3 or 2,
wherein (IV) the photoacid generator is an organic halogen compound.

11. The resin composition for a water-based coating material according to claim 10,
wherein (IV) the photoacid generator is a halogen-containing triazine compound, a vinylidene chloride copolymer, a vinyl chloride copolymer, or a chlorinated polyolefin.

12. The resin composition for a water-based coating material according to claim 3 or 2,
wherein (IV) the photoacid generator is a sulfonium salt or an iodonium salt.

13. The resin composition for a water-based coating material according to claim 3 or 2, wherein (V) the photobase generator is at least one selected from the group consisting of cobalt amine complexes, O-acyloximes, carbamic acid derivatives, formamide derivatives, quaternary ammonium salts, tosylamines, carbamates, and amineimide compounds.

14. The resin composition for a water-based coating material according to claim 13,
wherein (V) the photobase generator is an O-acyloxime compound.

15. The resin composition for a water-based coating material according to claim 14,
wherein (V) the photobase generator is an O-acyloxime containing an aryl group represented by the formula (3):

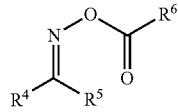

(3)

wherein $R^4$, $R^5$, and $R^6$ are each independently hydrogen, an alkyl group having 1 to 10 carbon atoms, an aryl group having 1 to 10 carbon atoms, or an aralkyl group having 1 to 10 carbon atoms, and at least one of the $R^4$, $R^5$, and $R^6$ has an aryl group.

16. The resin composition for a water-based coating material according to any one of claims 1 to 2, further comprising
(VI) an ultraviolet absorber,
wherein (VI) the ultraviolet absorber is a compound having at least one skeleton selected from the group consisting of a triazine skeleton, a benzophenone skeleton, a benzotriazole skeleton, a phenyl salicylate skeleton, and a phenyl benzoate skeleton.

17. The resin composition for a water-based coating material according to any one of claims 1 to 2, further comprising
(VII) a hindered amine light stabilizer,
wherein (VII) the hindered amine light stabilizer is a compound containing a piperidine ring represented by the formula (4):

$$-C(CH_3)_2-N(OR')-C(CH_3)_2-  \qquad (4)$$

wherein R' represents an organic group having 1 to 20 carbon atoms.

18. The resin composition for a water-based coating material according to claim 3 or 2, further comprising
(VIII) a compound capable of being activated by acid to promote hydrolysis and condensation of an alkoxysilyl group.

19. The resin composition for a water-based coating material according to claim 18,
wherein (VIII) the compound capable of being activated by acid to promote hydrolysis and condensation of an alkoxysilyl group is a salt of an acidic phosphate compound.

20. The resin composition for a water-based coating material according to any one of claims 1 to 2, further comprising
(IX) an inorganic pigment.

21. A resin composition for a one-pack water-based coating material, comprising the resin composition for a water-based coating material according to any one of claims 1 to 2.

22. A coated article and a coat film obtained from the resin composition for a one-pack water-based coating material according to claim 21.

* * * * *